United States Patent [19]

Hanson et al.

[11] Patent Number: 5,142,120
[45] Date of Patent: Aug. 25, 1992

[54] CONTACT COOLING OF A PROJECTION MASK

[75] Inventors: Eric G. Hanson, Burlingame; Si-Ty Lam, San Jose; William J. West, Los Altos, all of Calif.

[73] Assignee: Hewlett-Packard Company, Palo Alto, Calif.

[21] Appl. No.: 633,583

[22] Filed: Dec. 21, 1990

[51] Int. Cl.$^5$ ............................................. B23K 26/02
[52] U.S. Cl. ........................... 219/121.83; 219/121.84; 427/53.1
[58] Field of Search ................ 219/121.68, 121.69, 219/121.84; 427/53.1

[56] References Cited

U.S. PATENT DOCUMENTS

| | | | |
|---|---|---|---|
| 4,262,186 | 4/1981 | Provancher | 219/121.68 |
| 4,661,679 | 4/1987 | Pardee | 219/121 L |
| 4,780,177 | 10/1988 | Wojnarowski et al. | 219/121.69 |
| 4,791,436 | 12/1988 | Chan et al. | 346/140 R |
| 4,842,677 | 6/1989 | Wojnarowski et al. | 156/643 |
| 4,852,133 | 7/1989 | Ikeda et al. | 378/34 |
| 5,057,184 | 10/1991 | Gupta et al. | 219/121.85 X |

Primary Examiner—C. L. Albritton

[57] ABSTRACT

An apparatus and method for cooling a large-area, pass-through projection mask for excimer ablation. In a preferred embodiment, a laser-transparent window is spaced apart from the projection mask to provide a thermal escape path. The thermal escape path receives a liquid flow which is in direct contact with patterned masking material of the projection mask. The liquid, preferably deionized water, is caused to flow in a laminar fashion. The liquid intersects the laser energy of the excimer laser. In a second embodiment, the liquid flow is along the periphery of the patterned masking material.

19 Claims, 2 Drawing Sheets

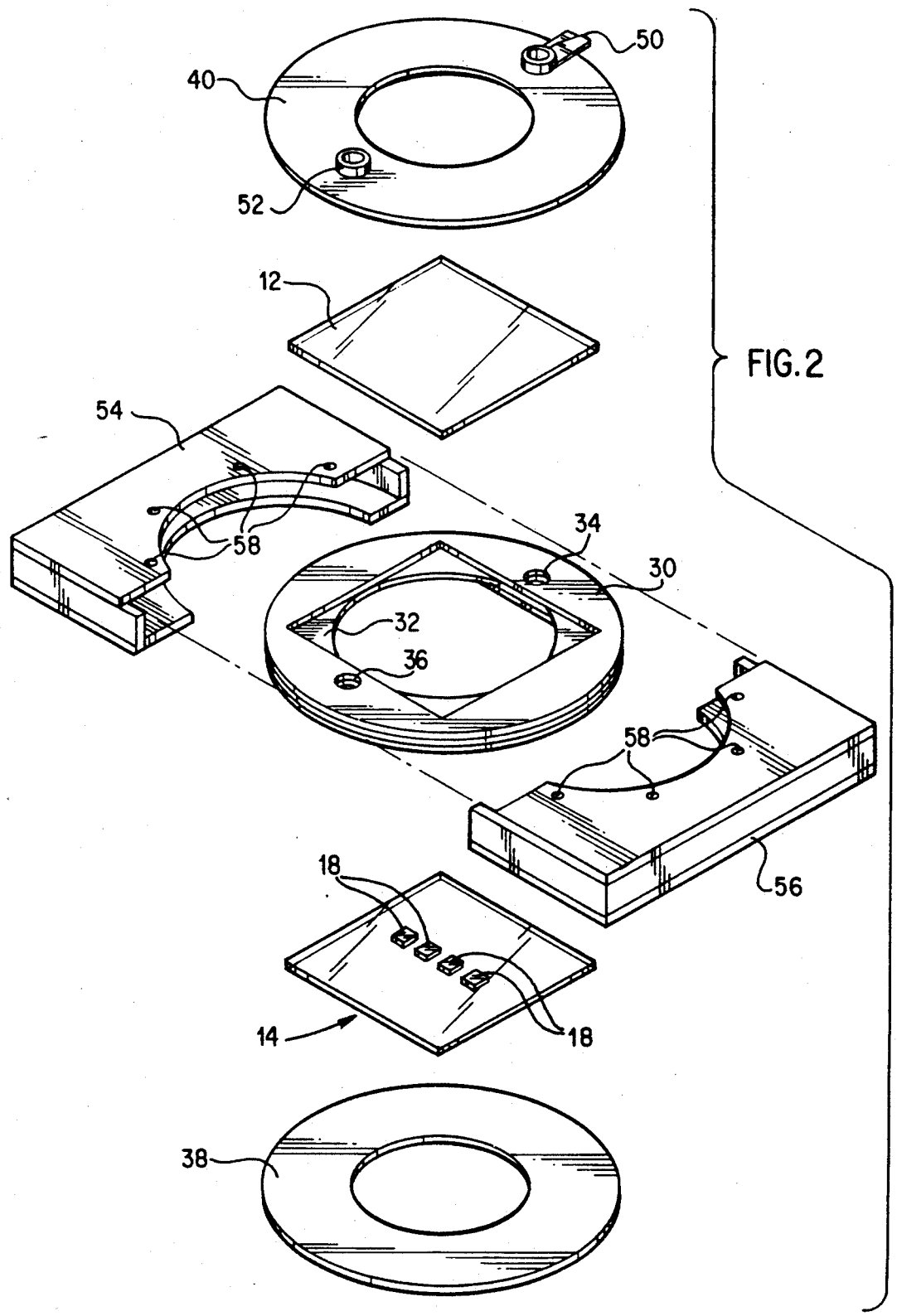

CONTACT COOLING OF A PROJECTION MASK

TECHNICAL FIELD

The present invention relates generally to microfabrication of a pattern on a substrate such as a wafer or an ink jet head and more particularly to the cooling of masks in an excimer laser ablation system.

BACKGROUND ART

In the microfabrication of devices, it is necessary to form grooves, holes or other indentations in substrates. For example, U.S. Pat. No. 4,791,436 to Chan et al., assigned to the assignee of the present application, teaches formation of grooves or serrations in the interior orifice bore of a nozzle plate in an ink jet printer. The desired features are provided by electroforming the nozzle plate on a mask having a sculptured or grooved outer surface area.

Ever-present goals in microfabrication include achieving a high throughput and achieving a high yield. Laser ablation is an attractive option in the industry. Particularly for fabrication of ink jet components, excimer laser ablation provides a number of advantages. However, excimer laser ablation systems typically use a single-aperture projection mask, so that there must be a mechanism for providing relative movement between the projection mask and the workpiece after each ablation. This places limitations on production throughput.

To improve a high throughput in thermal ink jet manufacturing, a large-area mask may be used. Such a mask allows many orifices or channels to be ablated simultaneously. For example, ablation of all of the features in a field of view of 25 square millimeters or more may be accomplished at a single time. Moreover, excimer laser ablation using a projection mask offers the advantage that a reduction mask may be used to limit the optical power density on the mask, thereby reducing the risk of mask damage.

One approach to production of large-area masks is to machine the mask in a free-standing sheet of metal. The problem with such an approach is that the masks are particularly susceptible to the detrimental effects of localized heating generated by impingement of the mask by laser energy. The resolution of the mask may be suitable for applications such as fabrication of vias in printed circuit boards which allow dimensional tolerances of 10 microns or more. However, the masks are inadequate for production of thermal ink jet components which require resolutions of approximately 1 micron.

Another approach to production of large-area masks is taught in U.S. Pat. No. 4,661,679 to Pardee. The patent teaches a semiconductor processing technique for transferring a circuit pattern without use of a pass-through mask. Excimer pulsed ultraviolet laser radiation is directed at a mirror having the circuit pattern thereon. An incident ray which strikes an anti-reflective portion of the mirror is absorbed into the mirror. On the other hand, an incident ray which strikes a laser-reflective portion of the pattern on the mirror is reflected to the semiconductor wafer. In this manner, the circuit pattern is transferred from the mirror to the semiconductor wafer. To reduce the distortion of the mirror due to incident energy induced heating, a number of tubes are positioned on the back side of the mirror opposite to the incident side of excimer pulsed ultraviolet laser radiation. The tubes may be used to conduct pressurized gas or liquid. The patent teaches that the mirror mask is superior to pass-through masks since pass-through masks suffer from distortion due to incident energy induced heating, while the mirror mask can employ backside cooling to control the surface temperature. Backside cooling in pass-through masks is difficult since cooling tubes would interfere with the desired pattern. On the other hand, the Pardee mask does little to address the distortions due to the difference in the thermal expansion of the laser-reflective portion and anti-reflective portion of the mirror. An alternative embodiment taught in the patent is to space apart the laser-reflective portion from the anti-reflective portion by a layer of refractive material. However, this embodiment does little to cool the laser-reflective portion and it is more difficult to etch the circuit pattern on the refractive portion than it is to manufacture conventional masks.

U.S. Pat. No. 4,842,677 to Wojnarowski et al. teaches a pass-through mask for excimer laser patterning. The mask comprises a quartz substrate on which is disposed a desired patterning in the form of a reflective metal. Desirable metals for production of the mask include aluminum and silver. The Wojnarowski et al. patent does not address the detrimental effects of localized heating of the mask by the excimer laser.

It is an object of the present invention to provide an apparatus and method for optically transferring a pattern from a large-area mask to a substrate, wherein the apparatus and method do not suffer from technical limitations imposed by cooling requirements of the mask and wherein the production of the mask is not made difficult.

SUMMARY OF THE INVENTION

The above object has been met by an apparatus and method which utilize a pass-through mask member and a thermal energy release path in direct contact with patterned masking material. The thermal energy release path is occupied by a flow of liquid, preferably deionized water, which is directed along the patterned masking material.

The apparatus includes a first laser-transparent member and a desired pattern of masking material on one surface of the first laser-transparent member. A second laser-transparent member is spaced apart from the surface on which the masking material is affixed to define a liquid flow path therebetween. The deionized water is caused to flow in a laminar fashion between the two laser-transparent members. The pattern of the masking material is transferred to a substrate, such as a thermal ink jet head, by directing pulsed excimer laser energy through the two laser-transparent members and the flow of liquid to impinge the substrate. In an alternative embodiment, the flow of liquid is restricted to the periphery of the masking material.

An advantage of the present invention is that it provides cooling at the location in which it will provide the greatest benefits, i.e., directly at the masking material. In the preferred embodiment the flow of liquid is across the entirety of the masking material and also contacts those areas of the first laser-transparent member not covered by the masking material. Thus, the pass-through mask is less susceptible to stresses resulting from the difference in the coefficients of expansion of the masking material and the laser-transparent member. Another advantage of the present invention is that the large-area mask allows use of a reduction lens, so that the optical power density on the mask may be limited.

BRIEF DESCRIPTION OF THE DRAWINGS

FIG. 2 is an exploded view of an apparatus for carrying out the method of FIG. 1.

BEST MODE FOR CARRYING OUT THE INVENTION

Figure 1:
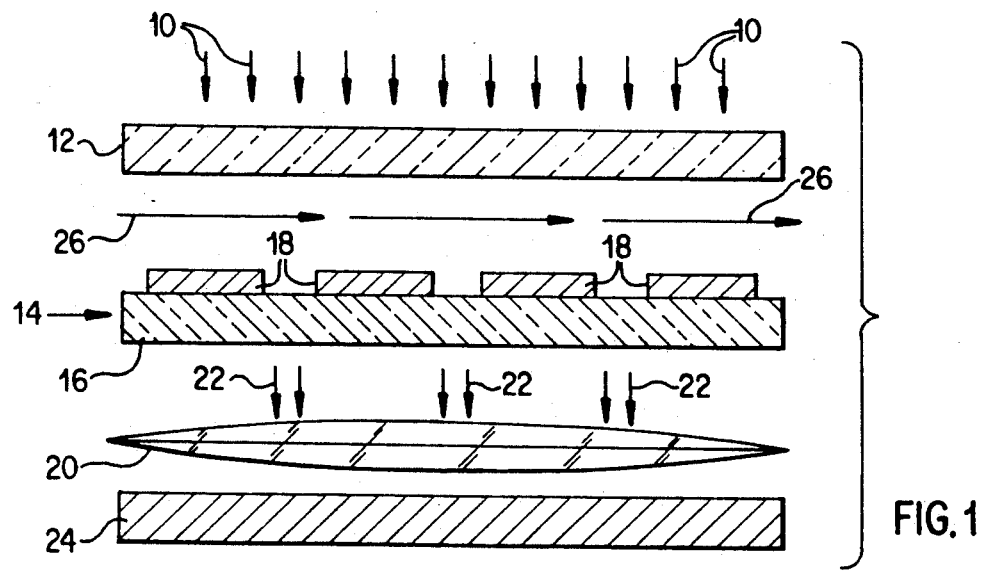
FIG. 1 is a schematic side sectional view of substrate patterning and mask cooling in accord with present invention.

With reference to FIG. 1, excimer pulsed laser radiation 10 is directed through a silica window 12 toward a large-area, pass-through projection mask 14. The projection mask is comprised of a silica substrate 16 and a pattern of masking material 18. Those areas of the silica substrate 16 not covered by the masking material 18 pass laser energy to a reduction lens 20. The passage of laser energy through the production mask 14 is shown by the three sets of arrows 22. The reduction mask 20 may provide a demagnification of 5X, for example. The laser energy then impinges a substrate 24 onto which the pattern of the masking material 18 is to be transferred.

The reduction lens 20 is well known in the art and is commercially available. The substrate 24 may be a layer of a thermal ink jet head for the patterning of orifices and ink channels, but this is not critical. Alternatively, the substrate 24 may be a semiconductor wafer for the microfabrication of a circuit pattern.

The pass-through mask 14 may be produced by use of plating and electroforming techniques. The silica substrate 16 has a thickness of 2 mm. The masking material 18 has a thickness of 5 microns. These dimensions are not critical. The masking material may be any of a wide range of materials, with nickel being the preferred metal because nickel is readily electroplated in thicknesses of several microns and is corrosive resistant. Susceptibility to corrosion is important since, as will be explained more fully below, a liquid is caused to flow between the masking material 18 and the silica window 12. Liquid flow is represented by arrows 26. A chrome layer of approximately 0.1 micron may be lithographically patterned onto the silica substrate 16, whereafter nickel or another suitable metal may be plated onto the chrome to provide the thickness of 5 microns.

The pattern of the masking material 18 is transferred to the substrate 24 by laser ablation. Impingement of a masking material by laser energy jeopardizes the resolution of the ablation, since the laser energy causes thermal expansion and, possibly, nucleate boiling. For a 5:1 reduction projection system with an exposure intensity of 40 mJ/cm$^2$ on the mask, an instantaneous surface temperature may jump hundreds of degrees Celsius for a laser pulse as short as 20 nsec.

The present invention includes the flow of liquid 26 in direct contact with the masking material 18, thereby providing a thermal energy escape path. Deionized water is the preferred liquid. A spacing between the silica window 12 and the silica substrate 16 of approximately 1 mm and a flow rate of 50 cm/sec has been discovered to be desirable. A thickness of 1 mm of deionized water will transmit ultraviolet radiation down to 190 nm, while a thickness of 1 cm will transmit down to 200 nm. A thickness in the range of 0.1 mm and 5 cm is preferred.

In this embodiment, the deionized water lies along the optical path, but prior to the exit from the pass-through mask. The deionized water flow is laminar and local temperature gradients in the mask are minor, so that reflective index gradients in the water do not create a significant distortion in the uniformity of laser illumination of the mask. The critical portion of the optical path extends from the projection mask 14 to the substrate 24 to be ablated, and the deionized water does not extend within this critical portion.

Figure 3:
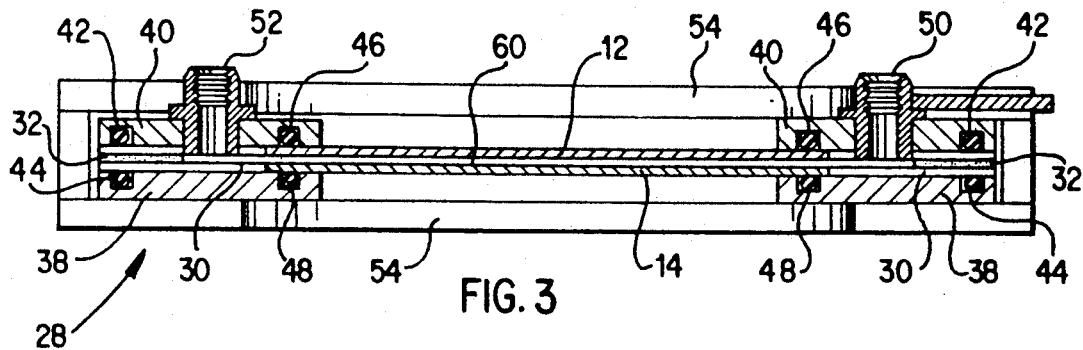
FIG. 3 is a side sectional view of the assembled apparatus of FIG. 2.

Referring now to FIGS. 2 and 3, a mask-cooling device 28 is shown as including the silica window 12 and the large-area, pass-through projection mask 14. In assembly, the silica window 12 is lowered to fit within a square opening in a spacer assembly 30. The silica window 12 and the projection mask 14 may be 10.16 cm × 10.16 cm. The square opening within the spacer assembly 30 is slightly greater than the dimensions of the silica window and the projection mask, so as to receive those members within the opening.

Fixed within the spacer assembly 30 is an elastomeric member 32. The elastomeric member is elongated at opposed ends to clear openings 34 and 36 in the top surface of the spacer assembly. The elongation of the elastomeric member allows fluid communication between the two openings 34 and 36 via the central portion of the spacer assembly. The silica window rests against the upper surface of the elastomeric member, while the projection mask rests against the lower surface. Thus, the thickness of the elastomeric member determines the spacing between the silica window and the projection mask.

A bottom cover 38 sandwiches the projection mask 14 within the square opening of the spacer assembly 32. In like manner, a top cover 40 traps the silica window 12. As best seen in FIG. 3, O-rings 42, 44, 46 and 48 provide a seal of the covers 38 and 40 to the spacer assembly 30. In assembly, the silica window 12 and the top cover 40 are lowered from the position shown in FIG. 2 so as to contact the spacer assembly 30. The top cover 40 includes a liquid inlet 50 and a liquid outlet 52 which are fittings adapted to be received within the opposed openings 34 and 36 of the spacer assembly. Because the elastomeric member 32 is elongated to clear passage for the openings 34 and 36, liquid may be introduced and extracted from the spacing between the silica window 12 and the projection mask 14. The inlet and outlet fittings are internally threaded to receive externally threaded members connected to a liquid supply.

The projection mask 14 and the bottom cover 38 are moved upwardly relative to the position shown in FIG. 2 until the bottom cover traps the projection mask in an aligned position against the elastic member 32 of the spacer assembly 30. After the bottom cover and the top cover have been properly positioned against the spacer assembly, a two-piece clamp assembly 54 and 56 is brought together. The mask-cooling device 38 is secured in a fully assembled condition by tightening of clamping screws into an array of internally threaded bores 58.

As noted above, the thickness of the elastomeric member 32 creates a spacing between the silica window 12 and the projection mask 14. This spacing is a liquid flow path 60 and is best illustrated in FIG. 3. The liquid inlet fitting 50 is in fluid communication with the liquid outlet fitting 52 via the spacing. Excimer pulsed laser radiation passes through the central openings in the clamping assembly 54 and the top cover 40 and passes through the silica window 12 to enter the liquid flow path 60. Within the liquid flow path, the laser energy impinges the masking material on the projection mask 14. In the absence of masking material, the laser energy continues through the projection mask for exit along the central openings of the bottom cover 38 and the clamping assembly 54.

Thermal calculations involving use of the present invention with a 5:1 reduction projection system and an exposure intensity of 40 mJ/cm$^2$ on the projection mask 14 show that the steady state temperature rise of the nickel masking material is approximately 20° C. During each laser pulse of 20 nsec, the instantaneous nickel surface temperature jumps by approximately an additional 195° C. However, only 40° C. of that 195° C. rise remains 1 $\mu$sec after the pulse, as the heat diffuses away from the nickel surface. Because the temperature rise is a short-duration spike, the temperature is well below the condition which would cause nucleate boiling. Furthermore, the steady state thermal expansion of the silica caused by the 20° C. change in temperature is only $1.1 \times 10^{-5}$, corresponding to 0.1 micron per centimeter of the polyimide which is to be ablated. This is clearly within acceptable levels. Peak stress at the nickel-silica interface which results from thermal expansion mismatch is approximately $5 \times 10^8$ dyne/cm$^2$, which is significantly lower than typical deposition-induced stresses, and causes no problem.

The above-cited calculations are based upon a 5 micron thick electroplated nickel mask layer and a liquid flow path spacing 60 of 1 mm. Higher thermal conductivity metals would reduce the instantaneous temperature spike at the metal surface during the laser pulse. However, the spike of the nickel mask laser has an amplitude which creates no problems, and a change to copper would only reduce the spike by a factor of 2.3. An option for reducing the temperature would be to use a metal with high ultraviolet reflectivity, such as aluminum. However, aluminum does not have the high corrosion resistance in deionized water, so that nickel and chromium are the preferred materials.

While the mask-cooling device 28 is shown as being oriented to provide a horizontal flow of liquid, the device may be placed on its end so that the flow is vertical. Important to the flow is that there are no bubbles or contaminants which would affect passage of the laser energy through the liquid flow. The flow is laminar, having a parabolic profile of the flow velocity. While there is a difference in the steady state temperature of the nickel mask layer at the inlet side as opposed to the outlet side, the temperature differential has no detrimental effects.

Figure 4:
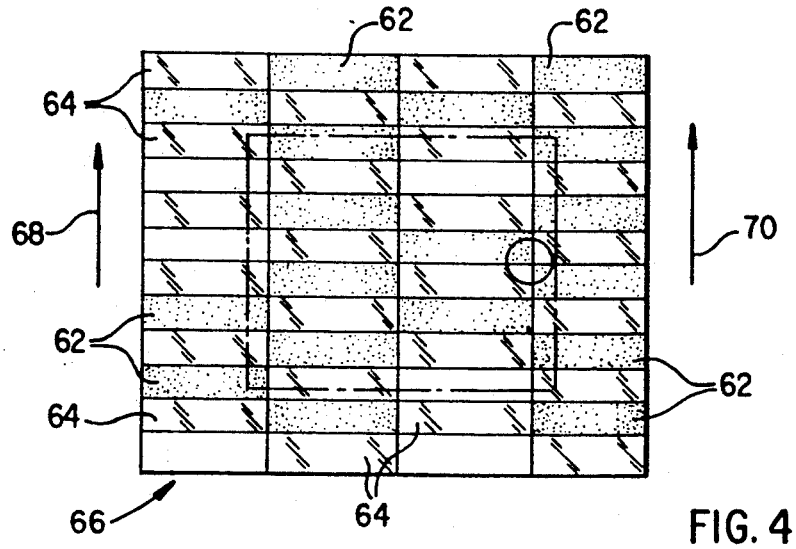
FIG. 4 is a top view of a second embodiment of the present invention.

FIG. 4 is an illustration of a second embodiment of the present invention. In this embodiment, masking material 62 is shown as being supported on a silica substrate 64 in the same manner as described above. A difference is that rather than providing a liquid flow path across the pass-through projection mask 66, cooling liquid is caused to flow along the periphery of the projection mask, as shown by arrows 68 and 70. In this embodiment, thermal energy must conduct laterally to provide cooling of the masking material.

Preferably, the projection mask 66 does not include the silica substrate 64, but rather is a free-standing metal mask. Because the lateral conduction of heat is less effective than the cooling process described with respect to the preferred embodiment, the masking material is made of a metal other than nickel. For example, copper may be used as a substitute material. Moreover, the masking metal should be coated with a material such as aluminum having a high reflectivity at the selected laser wavelength. This reduces the thermal loading by a factor of approximately 10.

We claim:

1. An apparatus used in optically transferring a pattern from a mask to a substrate by laser energy comprising, a pass-through mask member having a laser-transparent layer disposed in an optical path of laser energy, said mask member having masking material in a pattern to be optically transferred to a substrate, said masking material being patterned on a surface of said laser-transparent layer, and channel means having a laser window in spaced relation to said mask member for defining a liquid flow path therebetween such that liquid flows in direct contact with said masking material, thereby carrying thermal energy out of said masking material, said masking material being disposed within said liquid flow path to allow liquid flow across said masking material, said liquid flow path intersecting said optical path.

2. The apparatus of claim 1 wherein said laser window is spaced apart from said mask member by a distance in the range of 0.1 mm and 5 cm.

3. The apparatus of claim 1 wherein said laser window and said mask member are equidistantly spaced apart along the liquid flow path across said masking material.

4. The apparatus of claim 1 wherein said liquid flow path intersects said optical path at said masking material, said optical path being the path of excimer pulsed laser radiation, said liquid being of a type to permit passage of said radiation therethrough.

5. The apparatus claim 1 further comprising a reduction lens disposed in said optical path between said mask member and said substrate, said optical path being a path of excimer laser energy.

6. An apparatus used in optically transferring patterns by means of passing laser energy through a projection mask comprising, a first laser-transparent member, a pattern of masking material on a surface of said first laser-transparent member, a second laser-transparent member spaced apart from said masking material on said first laser-transparent member to define a liquid flow path therebetween, and supply means for directing a flow of liquid along said liquid flow path, thereby providing a cooling flow across said masking material, said supply means providing a liquid permitting the passage of laser energy therethrough.

7. The apparatus of claim 6 wherein said first and second laser-transparent members are generally parallel to each other and are spaced apart by a distance to provide a laminar flow of said liquid.

8. The apparatus of claim 6 wherein said first laser-transparent member and said masking material combine to form a large-area projection mask.

9. The apparatus of claim 6 wherein said masking material is one of nickel and chromium.

10. The apparatus of claim 6 wherein said first and second laser-transparent members are spaced apart by an elastomeric member.

11. The apparatus of claim 6 wherein said supply means directs deionized water.

12. A method of fabricating a pattern on a substrate comprising,
   patterning a masking material on a generally flat laser-transparent member,
   directing laser energy to impinge said masking material and to pass through said laser-transparent member where there is an absence of masking material,
   positioning a substrate such that said laser energy which passes through said laser transparent member impinges said substrate, and
   directing a cooling flow of liquid to contact said masking material, thereby providing a thermal energy path for heat generated by said impingement of said masking material by said laser energy.

13. The method of claim 14 wherein said step of directing a cooling flow of liquid is a step of channeling said liquid to intersect said beam of laser energy impinging said masking material.

14. The method of claim 13 wherein said step of directing a cooling flow of liquid is a step of channeling deionized water.

15. The method of claim 13 wherein said step of directing laser energy includes choosing a wavelength which will pass through said liquid without adversely affecting said fabricating of said pattern.

16. The method of claim 12 wherein said cooling flow of liquid is directed along the periphery of said masking material.

17. The method of claim 12 further comprising placing a laser-transparent window spaced apart from said laser-transparent member to define a flow path for said cooling flow of liquid.

18. The method of claim 12 wherein said step of directing laser energy is a step of directing excimer pulsed laser radiation.

19. An apparatus used in optically transferring a pattern from a mask to a substrate by laser energy comprising,
   a pass-through mask member disposed in an optical path of laser energy, said mask member having masking material in a pattern to be optically transferred to a substrate, said masking material having an outer periphery, and
   channel means for defining a liquid flow path in direct contact with said outer periphery of said masking material, thereby carrying thermal energy out of said masking material.

* * * * *